United States Patent
Hasegawa

(10) Patent No.: US 6,448,181 B2
(45) Date of Patent: Sep. 10, 2002

(54) METHOD FOR FORMING FILM

(75) Inventor: Toshio Hasegawa, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/757,582

(22) Filed: Jan. 11, 2001

(30) Foreign Application Priority Data

Jan. 13, 2000 (JP) ........................................ 2000-004994

(51) Int. Cl.$^7$ ............................................... H01L 21/44
(52) U.S. Cl. ......................................... 438/685; 438/905
(58) Field of Search ................................ 438/680, 905, 438/906, 685

(56) References Cited

U.S. PATENT DOCUMENTS

| | | | |
|---|---|---|---|
| 4,699,675 A | | 10/1987 | Longeway |
| 5,728,629 A | * | 3/1998 | Mizuno et al. ............. 438/680 |
| 5,942,282 A | * | 8/1999 | Tada et al. .................. 427/250 |
| 5,963,836 A | * | 10/1999 | Kang et al. ................. 438/682 |
| 6,022,586 A | * | 2/2000 | Hishimoto et al. ......... 427/237 |
| 6,211,065 B1 | * | 4/2001 | Xi et al. ..................... 438/627 |
| 6,323,129 B1 | * | 11/2001 | Moutinho .................. 438/680 |

FOREIGN PATENT DOCUMENTS

| | | |
|---|---|---|
| JP | 4-349624 | 12/1992 |
| JP | 4-350169 | 12/1992 |
| JP | 5-109654 | 4/1993 |
| JP | 4-349196 | 12/1993 |

* cited by examiner

Primary Examiner—Richard Booth
Assistant Examiner—Angel Roman
(74) Attorney, Agent, or Firm—Smith, Gambrell & Russell, LLP

(57) ABSTRACT

A method for forming a film according to the invention includes a setting step for putting an object to be processed in a processing container that can be brought into a vacuum, and a film-forming step for introducing both of a high-melting-point metal composition gas and a reducing gas into the processing container in order to deposit a predetermined film onto a surface of the object to be processed, subsequently to the setting step. In addition, the method also includes a pre-flowing step for introducing only one of the high-melting-point metal composition gas and the reducing gas into the processing container for a predetermined time, before the setting step.

20 Claims, 8 Drawing Sheets

METHOD FOR FORMING FILM

BACKGROUND OF THE INVENTION

1. Field of the Invention

This invention relates to a method for forming a film with which a film can be deposited on a semiconductor wafer or the like.

2. Background of the Invention

In general, when a semiconductor integrated circuit is manufactured, a film-forming process and a pattern-etching process are repeated in turn to a silicon substrate such as a semiconductor wafer in order to form many desired devices.

A barrier metal is used just below a circuit layer that can electrically connect respective devices with each other in order to prevent a mutual diffusion between a substrate of Si and a circuit material of the circuit layer, and/or in order to prevent a detachment with respect to a ground layer. The barrier metal has to be a material having a low electrical resistance and a superior corrosion resistance. For example, a metal material having a high melting point such as a TiN film may be often used as the barrier metal.

In general, the barrier metal consisting of the TiN film may be formed by a thermal CVD by using $TiCl_4$ gas as a high-melting-point metal compound gas and $NH_3$ gas as a reducing gas.

In addition, in general, a pre-coated film consisting of a same kind of film as a film to be deposited i.e. a TiN film in the case is formed in advance on a surface of a stage for placing the semiconductor wafer in a film-forming unit that can conduct such a film-forming process, in order to maintain a thermal uniformity within a surface of the wafer and prevent a metal contamination caused by metal elements included in the stage. The pre-coated film is removed every when a cleaning process is conducted to the film-forming unit (for example, after a predetermined number of the wafers are processed). Thus, every after the cleaning process, as a pre-process, the thin pre-coated film is deposited on the surface of the stage.

The film-forming unit conducts the film-forming process to a semiconductor wafer that has been processed in a previous step of the film-forming process. Thus, the film-forming process is not always continuously conducted to a plurality of semiconductor wafers in the film-forming unit. For example, after the film-forming process is successively conducted one by one to twenty five semiconductor wafers that can be accommodated in one cassette, the film-forming unit may stay in an idling state for a time till a next cassette is conveyed and set. After the next cassette that accommodates preprocessed semiconductor wafers is conveyed and set, the film-forming unit may be back in the fully operating state. Then, the film-forming process is successively conducted one by one to twenty five semiconductor wafers in order to form the film. As described above, in general, the idling state and the fully operating state are repeated in turn.

In the above case, the time for the idling state may be long and/or short according to the completion state of the previous step of the film-forming process. For example, the time may be 10 minutes to 1 hour or more.

FIG. 8 shows an example of timing chart of the above conventional film-forming method. In the case, after the film-forming process is successively conducted to twenty-five semiconductor wafers in the film-forming unit, the film-forming unit stays in an idling state for 1 hour. After the idling, the film-forming process is successively conducted to next twenty-five semiconductor wafers, again. In the case, a process temperature of the film-forming state is for example 680° C. but a waiting temperature of the idling state is reduced to for example 550° C. in order to save energy. In addition, during the idling state, in order to prepare to resume the next film-forming process, an inert gas such as $N_2$ gas is introduced into a processing container in the film-forming unit that can be brought into vacuum. Thus, it is prevented that an impure gas comes into the processing container or the like and that an environment in the processing container is changed or fluctuated.

As described above, in order to prevent the change of the environment in the processing container or the like, during the idling state, the $N_2$ gas is continuously introduced. However, when the film-forming process is resumed and successively conducted to for example twenty-five semiconductor wafers again after the idling, a thickness of a film formed on only a first semiconductor wafer may tend to be not uniform. That is, the thickness of the film on the first wafer may be thicker or thinner than a desired thickness. In addition, repeatablity of the thickness of the film on the first wafer is not good and uniformity of the thickness within the film on the first wafer is not good. Thus, a dummy wafer is often used as the first semiconductor wafer just after resuming the film-forming process. The above problem happens only in the first semiconductor wafer just after resuming the film-forming process after the idling. The problem may also cause a low yield.

It may be thought that deterioration of the repeatability of the thickness of the film, especially on the first wafer after resuming the film-forming process, may be caused by a or more gases that have adhered to an inside wall of a pipe for the gases or an inside wall of the processing container. However, in addition, the thickness of the film on the first wafer may be thicker or thinner based on a condition of the pre-coated film on the stage or the like in each of film-forming units or even in the same film-forming unit. At present, although causes of the above problem have not been solved sufficiently, it has been required to prevent the above problem.

SUMMARY OF THE INVENTION

This invention is intended to solve the above problems. The object of this invention is to provide a method for forming a film that can improve repeatablity and uniformity with respect to a thickness of the film formed on a first object to be processed just after resuming a film-forming process after a long idling state.

The inventor has studied the repeatability of the thickness of the film eagerly and carefully. As a result, with respect to the film-forming process for the first object to be processed when resuming the film-forming process after the long idling state, the inventor has found that the repeatability can be improved by introducing only one of a material gas and a reducing gas for a short time as a pre-process just before the film-forming process.

That is, the invention is a method for forming a film comprising; a setting step for putting an object to be processed in a processing container that can be brought into a vacuum; a film-forming step for introducing both of a high-melting-point metal composition gas and a reducing gas into the processing container in order to deposit a predetermined film onto a surface of the object to be processed, subsequently to the setting step; and a pre-flowing step for introducing only one of the high-melting-point metal composition gas and the reducing gas into the processing container for a predetermined time, before the setting step.

According to the invention, atmosphere in the processing container can be maintained at substantially the same state as during the continuous film-forming process. Thus, repeatablity of a thickness of the film and uniformity of the thickness within the film can be improved.

The invention is more effective if the method further includes an idling step during which neither the high-melting-point metal composition gas nor the reducing gas is introduced into the processing container for a predetermined time, just before the pre-flowing step.

In the case, preferably, a high-melting-point metal composition gas is introduced into the processing container in the pre-flowing step, when a thickness of a film deposited on a first object to be processed in the just subsequent film-forming step tends to be thinner than a thickness of a film deposited on each of the subsequent objects to be processed if neither the high-melting-point metal composition gas nor the reducing gas are introduced in the pre-flowing step and a plurality of objects to be processed are processed in the subsequent film-forming step.

Alternatively, preferably, a reducing gas is introduced into the processing container in the pre-flowing step, when a thickness of a film deposited on a first object to be processed in the just subsequent film-forming step tends to be thicker than a thickness of a film deposited on each of the subsequent objects to be processed if neither the high-melting-point metal composition gas nor the reducing gas are introduced in the pre-flowing step and a plurality of objects to be processed are processed in the subsequent film-forming step.

The invention is also more effective if the method further includes an idling step during which said only one of the high-melting-point metal composition gas and the reducing gas is not introduced into the processing container for a predetermined time, just before the pre-flowing step.

As an example of the invention, a plurality of objects to be processed are put in the processing container in turn in the setting step, and a predetermined film is deposited on each of the plurality of objects to be processed successively in the film-forming step.

In the case, a high-melting-point metal composition gas is preferably introduced into the processing container in the pre-flowing step, when a thickness of a film deposited on a first object to be processed in the just subsequent film-forming step tends to be thinner than a thickness of a film deposited on each of the subsequent objects to be processed if neither the high-melting-point metal composition gas nor the reducing gas are introduced in the pre-flowing step.

Alternatively, a reducing gas is preferably introduced into the processing container in the pre-flowing step, when a thickness of a film deposited on a first object to be processed in the just subsequent film-forming step tends to be thicker than a thickness of a film deposited on each of the subsequent objects to be processed if neither the high-melting-point metal composition gas nor the reducing gas are introduced in the pre-flowing step.

In the former case, only the high-melting-point metal composition gas may be introduced into the processing container for example for 5 seconds or more in the pre-flowing step. In the latter case, only the reducing gas is introduced into the processing container for example for 10 seconds or more in the pre-flowing step.

In addition, the former manner is effective if the method includes an idling step during which the high-melting-point metal composition gas is not introduced into the processing container for a predetermined time, just before the pre-flowing step. The latter manner is effective if the method includes an idling step during which the reducing gas is not introduced into the processing container for a predetermined time, just before the pre-flowing step.

The high-melting-point metal composition gas may be for example $TiCl_4$ gas, and the reducing gas may be for example $NH_3$ gas.

DESCRIPTION OF THE PREFERRED EMBODIMENT

Embodiments of the invention will now be described in more detail with reference to accompanied drawings.

Figure 1:
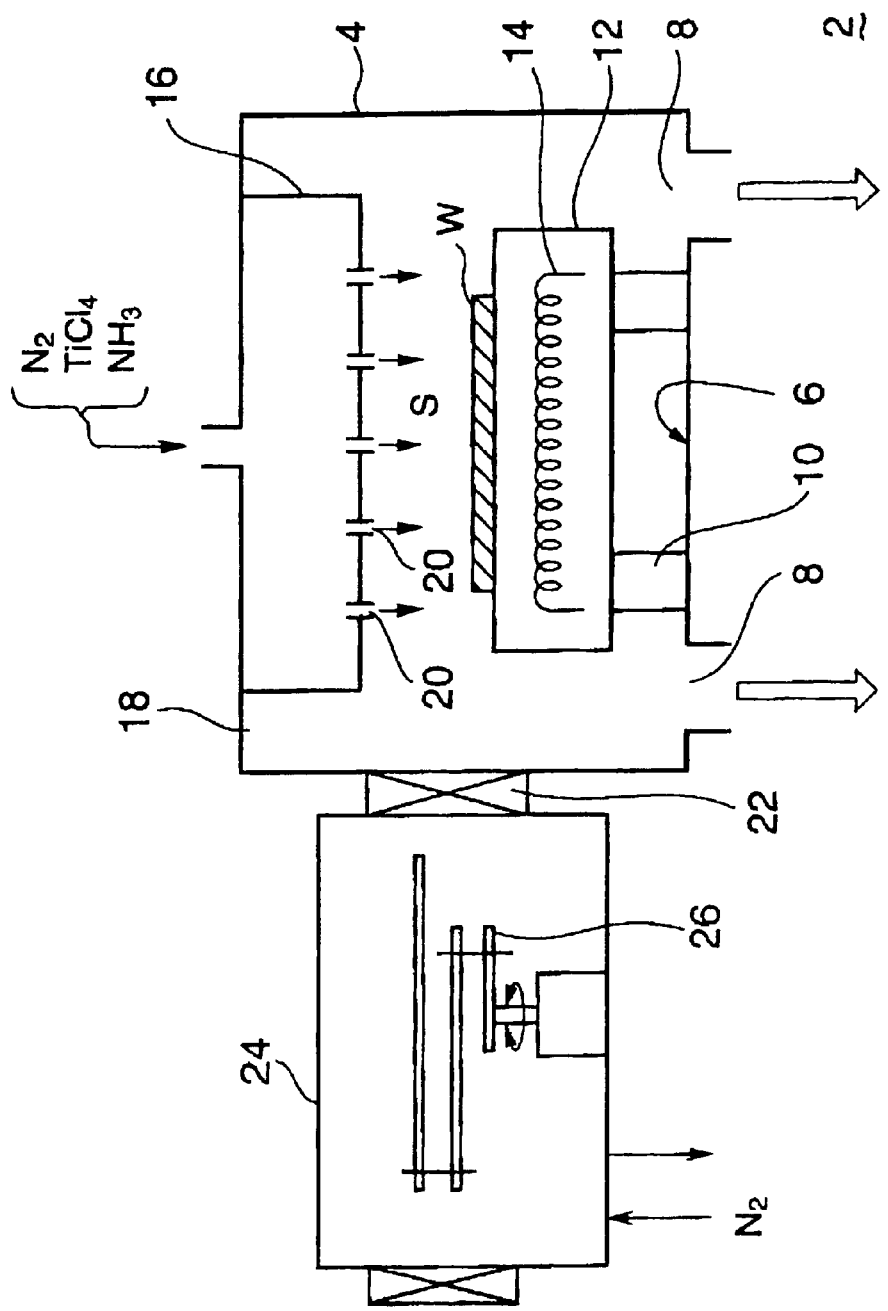
FIG. 1 is a schematic view of a film-forming unit for conducting a method according to the invention.
Figure 2:
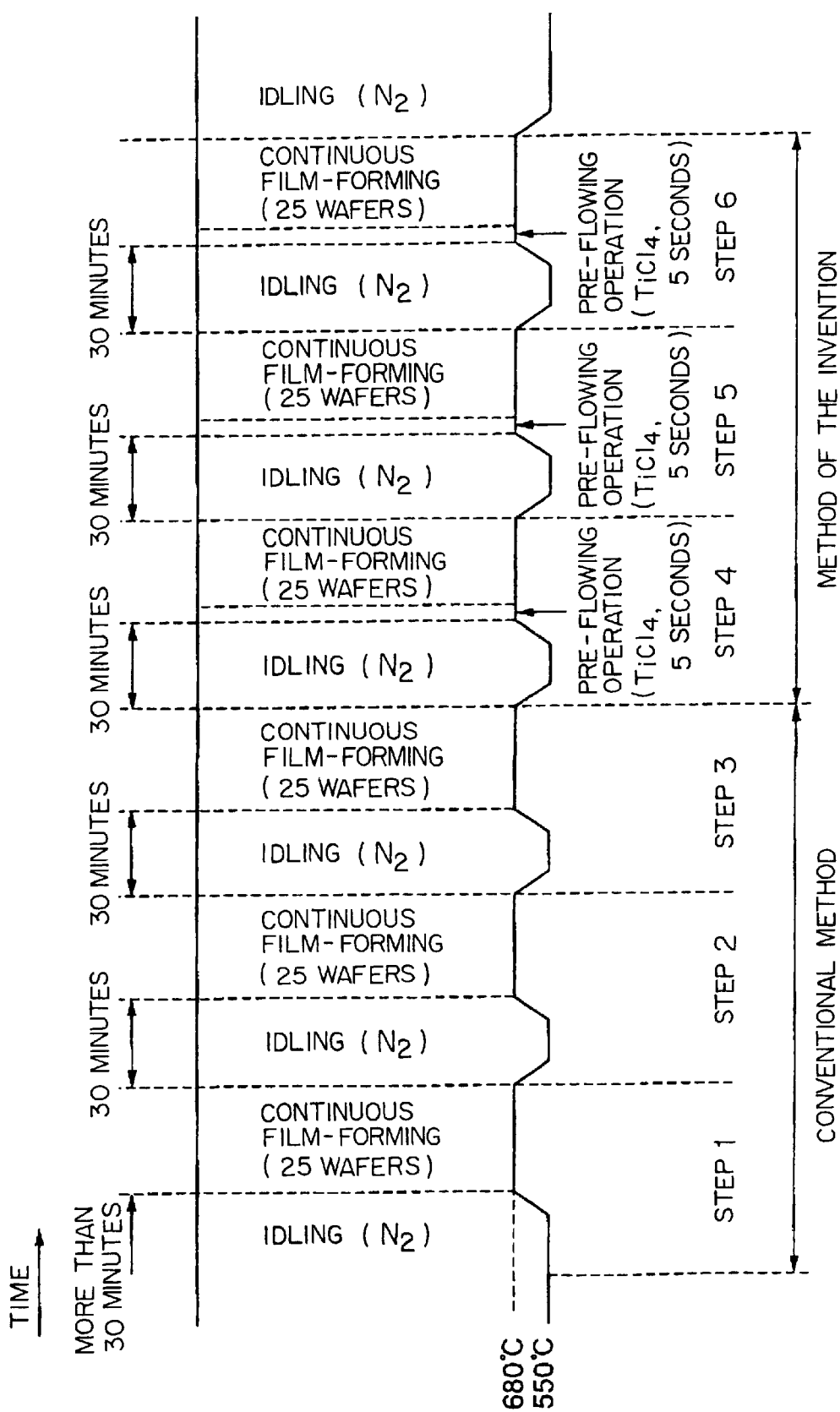
FIG. 2 is a timing chart for comparing the method according to the invention to a conventional method.
Figure 3:
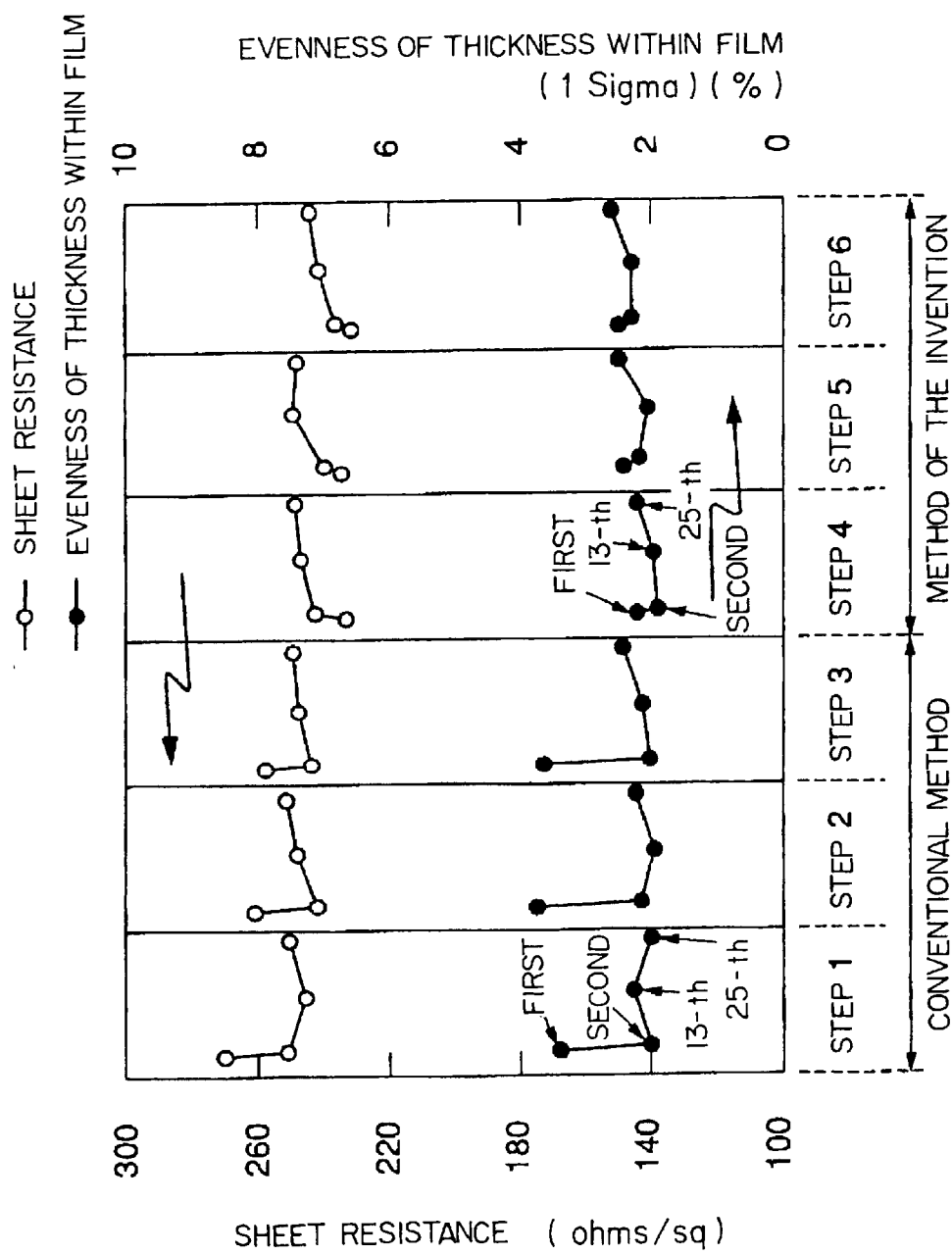
FIG. 3 is a graph for showing a result of films deposited by the method shown in FIG. 2.

An example of film-forming unit for conducting a method according to the invention is explained at first. FIG. 1 is a schematic view of a film-forming unit for conducting a method according to the invention, FIG. 2 is a timing chart for comparing the method according to the invention to a conventional method, and FIG. 3 is a graph for showing a result about thicknesses of films deposited by the method shown in FIG. 2.

In the embodiment, a case of forming a TiN film by using $TiCl_4$ gas (a high-melting-point metal halogen composition gas) as a high-melting-point metal composition gas and $NH_3$ gas as a reducing gas is explained.

As shown in FIG. 1, the film-forming unit 2 has a processing container 4, which is made of for example stainless steel and shaped cylindrically. Discharging ports 8 are formed at a base portion 6 of the processing container 4 in order to discharge atmosphere in the processing container 4. A discharging system (not shown) having a vacuum pump is connected to the discharging ports 8. Thus, the processing container 4 can be substantially uniformly exhausted from the base portion 6 through the peripheral discharging ports 8.

A support 10 is provided in the processing container 4. A circular stage 12 is supported on the support 10. An object to be processed such as a semiconductor wafer W is adapted to be placed on the circular stage 12. In more detail, the stage 12 is made of ceramics such as AlN, and a resistance heater 14 is buried in the stage 12 as heating means. A pre-coated film (not shown) is formed onto a surface of the stage 12 overall.

A ceiling plate 18 integrally provided with a showerhead 16 for supplying a necessary process gas is hermetically attached to a side wall of the processing container 4 at a ceiling portion of the processing container 4. The showerhead 16 faces oppositely to the substantially whole upper surface of the stage 12, so that a process space S is formed between the showerhead 16 and the stage 12. The showerhead 16 is adapted to introduce various gases into the space S in a shower-like manner. In the case, many jetting holes 20 for jetting the gases are formed at the base portion (jetting surface) of the showerhead 16.

A gate-valve 22 is provided at a side wall of the processing container 4. The gate-valve 22 can hermetically open and close when a wafer is conveyed into or out of the processing container 4. A load-lock chamber 24 that can be brought into a vacuum is arranged adjacent to the processing container 4 via the gate-valve 22. A multi-joint arm 26 is arranged in a pivotable and extendable/retractable manner in the load-lock chamber 24 in order to convey the wafer W. If necessary, $N_2$gas may be introduced into the load-lock chamber 24 as well. In addition, a transfer chamber may be arranged instead of the load-lock chamber 24. A cassette chamber (not shown) or the like may be connected to the load-lock chamber 24.

Next, the method according to the invention that can be conducted by using the above unit is explained.

At first, a flow of a semiconductor wafer W at a general film-forming process is explained. While there is no wafers to be processed, the film-forming unit is maintained at an idling state. When wafers to be processed come into the load-lock chamber 24, the load-lock chamber 24 is brought into a vacuum. After a pressure in the load-lock chamber 24 substantially reaches a pressure in the processing container 4 that has been brought into a vacuum in advance, the gate-valve 22 opens to make the chambers 24 and 4 communicate with each other. Then, the multi-joint arm 26 is operated so that a preprocessed semiconductor wafer W in the load-lock chamber 24 is loaded (conveyed) into the processing container 4, and placed on the stage 12. Herein, just before the load-lock chamber 24 and the processing container 4 communicate with each other, the pressure in the load-lock chamber 24 is preferably set higher than the pressure in the processing container 4 for example by about 7 to 14 Pa (≈50 to 100 mTorr). In the case, when the load-lock chamber 24 and the processing container 4 communicate with each other, it is prevented that atmosphere in the processing container 4 flows into the load-lock chamber 24.

After the wafer W is loaded, the film-forming process is started. Herein, the TiN film is formed by a thermal CVD at a process temperature of for example 680° C. by using the $TiCl_4$ gas and the $NH_3$ gas.

After the film-forming process is completed, the processed wafer W is unloaded (conveyed out) from the processing container 4 to the load-lock chamber 24. Then, next preprocessed wafer is loaded into the processing container 4, and the TiN film is formed thereon in the same manner as described above. Thus, the film-forming process is continuously conducted as far as there are preprocessed wafers W.

When all the preprocessed wafers vanish (when all the wafers W are processed), the film-forming unit 2 is set in an idling state. During the idling state, the $N_2$ gas is introduced into the processing container 4. In addition, in order to save energy for heating, a temperature of the stage 12 is reduced from the process temperature (for example 680° C.) to a lower temperature (for example 550° C.). Herein, if the temperature of the stage 12 is reduced too much, it may need longer time to raise and stable the temperature of the stage 12 when resuming the film-forming process. Thus, as described above, the reduced temperature is preferably about 550° C.

In the embodiment according to the invention, a pre-flowing step is performed just before the film-forming process is conducted to a first wafer after the idling of a long time (at least several minutes). In the pre-flowing step, only one of the $TiCl_4$ gas being the high-melting-point metal composition gas and the $NH_3$ gas being the reducing gas is introduced into the processing container 4 for a predetermined short time. In the case, the $TiCl_4$ gas is introduced in the pre-flowing step.

In more detail, before the continuous film-forming process just after the idling, only the $TiCl_4$ gas is introduced into the processing container 4 for example for 5 seconds. Thus, the atmosphere in the processing container 4 can be improved. When the $TiCl_4$ gas is introduced, the wafer W has not been loaded yet. The wafer W is loaded into the processing container 4 after the pre-flowing step. After that, the continuous film-forming process is conducted.

Thus, the thickness of the film deposited on the first wafer W can be substantially the same as the thickness of the film deposited on each of the second and more wafers. That is, the repeatability of the thickness of the film can be improved. In addition, the uniformity of the thickness within the film can be improved.

Actually, a film-forming step and an idling step were repeated in turn. The film-forming step was conducted six times overall. Twenty-five semiconductor wafers W were continuously processed during each of the film-forming steps. That is, one hundred and fifty semiconductor wafers W were processed overall. The result of the case is explained. FIG. 2 shows a timing chart of this case. As shown in FIG. 2, the steps 1 to 3 are conventional methods, and the steps 4 to 6 are methods according to the invention.

As shown in FIG. 2, the film-forming process of the TiN film was continuously conducted to twenty-five semiconductor wafers W by using the $TiCl_4$ gas and the $NH_3$ gas, during each continuous film-forming step. At that time, the process temperature was about 680° C., the process pressure was about 40 Pa. Each idling step was continued for about 30minutes. During each idling step, the temperature of the stage was reduced to about 550° C. It took about 10 minutes to raise or reduce the temperature of the stage, respectively.

In the steps 4 to 6 according to the invention, just before starting the continuous film-forming process, only the $TiCl_4$ gas was introduced into the processing container 4 for 5 seconds before the wafers W were loaded (a pre-flowing operation).

FIG. 3 shows a measured result about the thickness of the film deposited on each of the wafers according to the above steps. In fact, instead of the thickness of the film, a sheet resistance of the film was measured. The sheet resistance corresponds to the thickness of the film in a one-to-one relationship. That is, when the sheet resistance is greater, the thickness of the film is thinner. On the contrary, when the sheet resistance is smaller, the thickness of the film is thicker. The measurement of the thickness (i.e. sheet resistance) was conducted at 49 points with respect to each of the wafers. Each value shown in the graph of FIG. 3 was an average value of measured data at the 49 points. In addition, the uniformity of the thickness within the film was calculated by the measured data at the 49 points. In FIG. 3, respective values of the films on the first wafer, the second wafer, the thirteenth wafer and the twenty-fifth wafer are shown typically.

As seen clearly from the graph of FIG. 3, in the conventional steps 1 to 3, the sheet resistance of the film on the first wafer is extremely higher than the sheet resistance of the film on each of the other wafers, i.e. the second wafer, the thirteenth wafer and the twenty-fifth wafer. That is, the thickness of the film on the first wafer is extremely thinner than that on each of the other wafers. In addition, the sheet resistance of the film on each of the second or more wafers is substantially the same. In addition, in the conventional steps 1 to 3, the uniformity of the thickness within the film on the first wafer is also far inferior.

On the other hand, in the steps 4 to 6 according to the invention, the sheet resistance (thickness) of the film on the first wafer is substantially the same as the sheet resistance (thickness) of the film on each of the other wafers. In addition, the uniformity of the thickness within the film on the first wafer is also extremely improved.

Thus, if there is an idling step of a certain time, the repeatability of the thickness of the film deposited on the first wafer and the uniformity of the thickness within the film deposited on the first wafer can be extremely improved by introducing the $TiCl_4$ gas for at least a few seconds just before resuming the next film-forming process. The reason may be thought as follows. In the idling step, the $TiCl_4$ gas that has adhered to an inside wall of a pipe for the gas or an inside wall of the processing container can be eliminated away therefrom. Thus, if the pre-flowing operation is not performed, in the film-forming process to the first wafer, a portion of supplied $TiCl_4$ gas is consumed to adhere to the inside wall of the pipe for the gas or the inside wall of the processing container.

In the above case, the $TiCl_4$ gas may be introduced for a time longer than 5 seconds. In addition, during the idling step, the temperature of the stage 12 may be maintained at for example 680° C. that is substantially the same as the process temperature.

In the above embodiment, the time of the idling step was 30 minutes. However, the time is not limited by the value, but could be several minutes or 10 minutes. In the case as well, it is preferable to perform the pre-flowing step according to the invention.

Herein, it should be noted that the $TiCl_4$ gas being a high-melting-point metal composition gas is introduced into the processing container by the pre-flowing operation of each of the steps 4 to 6 of the invention because the sheet resistance of the film deposited on the first wafer according to the conventional method (steps 1 to 3) wherein the supply of the $TiCl_4$ gas and the supply of the $NH_3$ gas are started at the same time tends to be higher. On the contrary, when the sheet resistance of the film deposited on the first wafer according to the conventional method tends to be lower, the $NH_3$ gas being a reducing gas should be introduced into the processing container by the pre-flowing operation.

Herein, in order to further confirm effectiveness of the method of the invention, the continuous film-forming processes were conducted together with other various preprocesses, respectively, instead of the above pre-flowing operation. The result of the case is explained.

Figure 4:
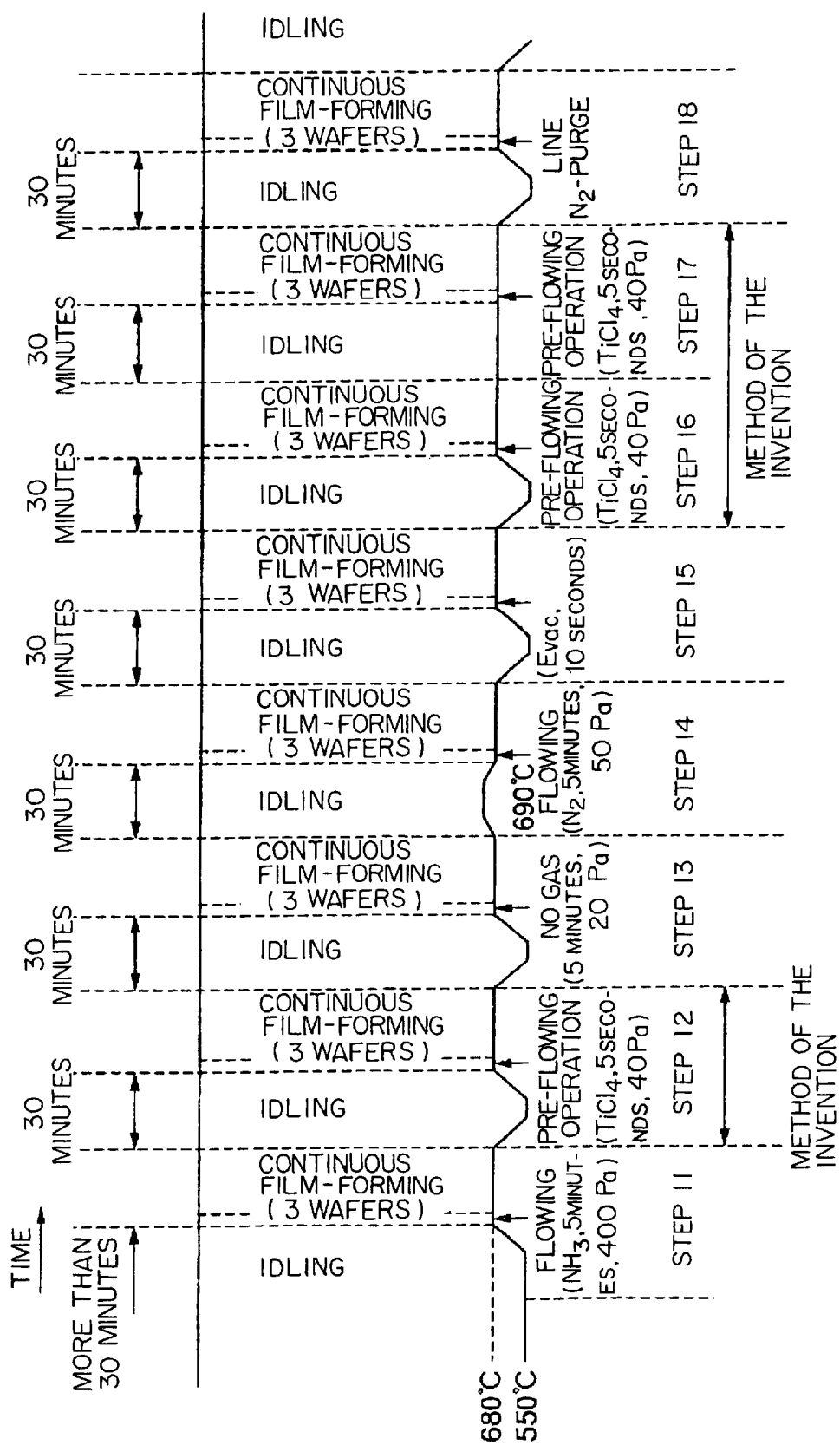
FIG. 4 is a timing chart for explaining various preprocesses that can conducted before the continuous film-forming process.
Figure 5:
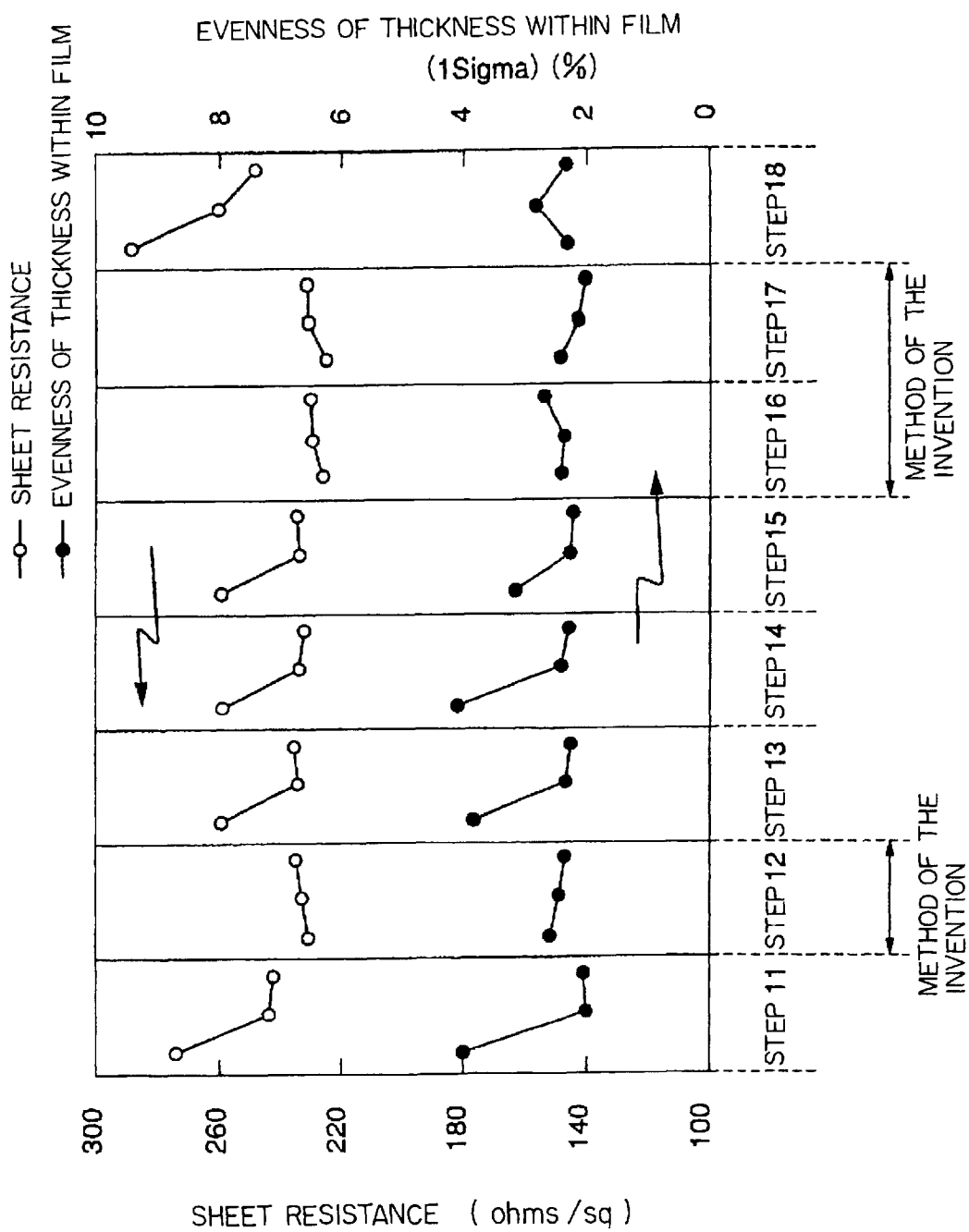
FIG. 5 is a graph for showing a result of films deposited by the method shown in FIG. 4.

FIG. 4 is a timing chart for explaining the various preprocesses that were conducted before the respective continuous film-forming processes. FIG. 5 is a graph for showing a result about the thickness of the film deposited on each of the wafers according to the timing chart shown in FIG. 4.

In the case, the film-forming process of the TiN film was continuously conducted to three semiconductor wafers W by using the $TiCl_4$ gas and the $NH_3$ gas, during each continuous film-forming step. At that time, the process temperature was about 680° C. Each idling step was continued for about 30 minutes, similarly to the case shown in FIG. 2. In the steps 12, 16 and 17 according to the invention, just before starting the continuous film-forming process, the $TiCl_4$ gas was introduced into the processing container 4 only for 5 seconds before the wafers W were loaded (a pre-flowing operation).

Other preprocesses were performed in the other steps 11, 13, 14, 15 and 18, respectively, instead of the pre-flowing operation, just before starting the continuous film-forming process. That is, in the step 11, $NH_3$ gas being a reducing gas was introduced into the processing container 4 only for 5 minutes just before starting the continuous film-forming process. In the step 13, no gas was introduced only for 5 minutes just before starting the continuous film-forming process. In the step 14, $N_2$ gas was introduced into the processing container 4 only for 5 minutes just before starting the continuous film-forming process, and the temperature of the stage was raised a little to 690° C. during the idling step. In the step 15, $N_2$ gas was discharged directly through an Evac line (not shown) detouring the processing container 4 only for 10 seconds just before starting the continuous film-forming process. In the step 18, a supply line of the $TiCl_4$ gas was purged by $N_2$ gas just before starting the continuous film-forming process.

As shown in FIG. 5, in the steps 11, 13 to 15 and 18, the sheet resistance of the film deposited on the first wafer is extremely higher than the sheet resistance of the film deposited on each of the other two wafers. That is, the thickness of the film deposited on the first wafer is extremely thinner than that on each of the other two wafers. In addition, in some of the above steps, the uniformity of the thickness within the film deposited on the first wafer reaches about 4%. That is not preferable performance.

On the other hand, in the steps 12, 16 and 17 according to the invention, the sheet resistance (thickness) of the film deposited on the first wafer is substantially the same as the sheet resistance (thickness) of the film deposited on each of the other two wafers. That is, the repeatability of the thickness of the film is extremely improved. In addition, the uniformity of the thickness within the film on the first wafer is also extremely improved.

As described above, when the film-forming process is resumed after the idling time being at least a few minutes, the repeatability of the thickness of the film deposited on the first wafer and the uniformity of the thickness within the film deposited on the first wafer can be extremely improved by introducing only the $TiCl_4$gas into the processing container only or at least a few seconds before the film-forming process to he first wafer.

In the above embodiments, the $TiCl_4$ gas is introduced in he pre-flowing operation. This manner is suitable for a state of the film-forming unit wherein the sheet resistance of the film deposited on the first wafer according to the conventional method not including the pre-flowing operation tends to be higher. On the other hand, the film-forming unit may be in another state wherein the sheet resistance of the film deposited on the first wafer according to the conventional method not including the pre-flowing step tends to be lower. For the latter state, it is preferable that $NH_3$ gas being a reducing gas is introduced in the pre-flowing operation instead of the $TiCl_4$ gas.

Figure 6:
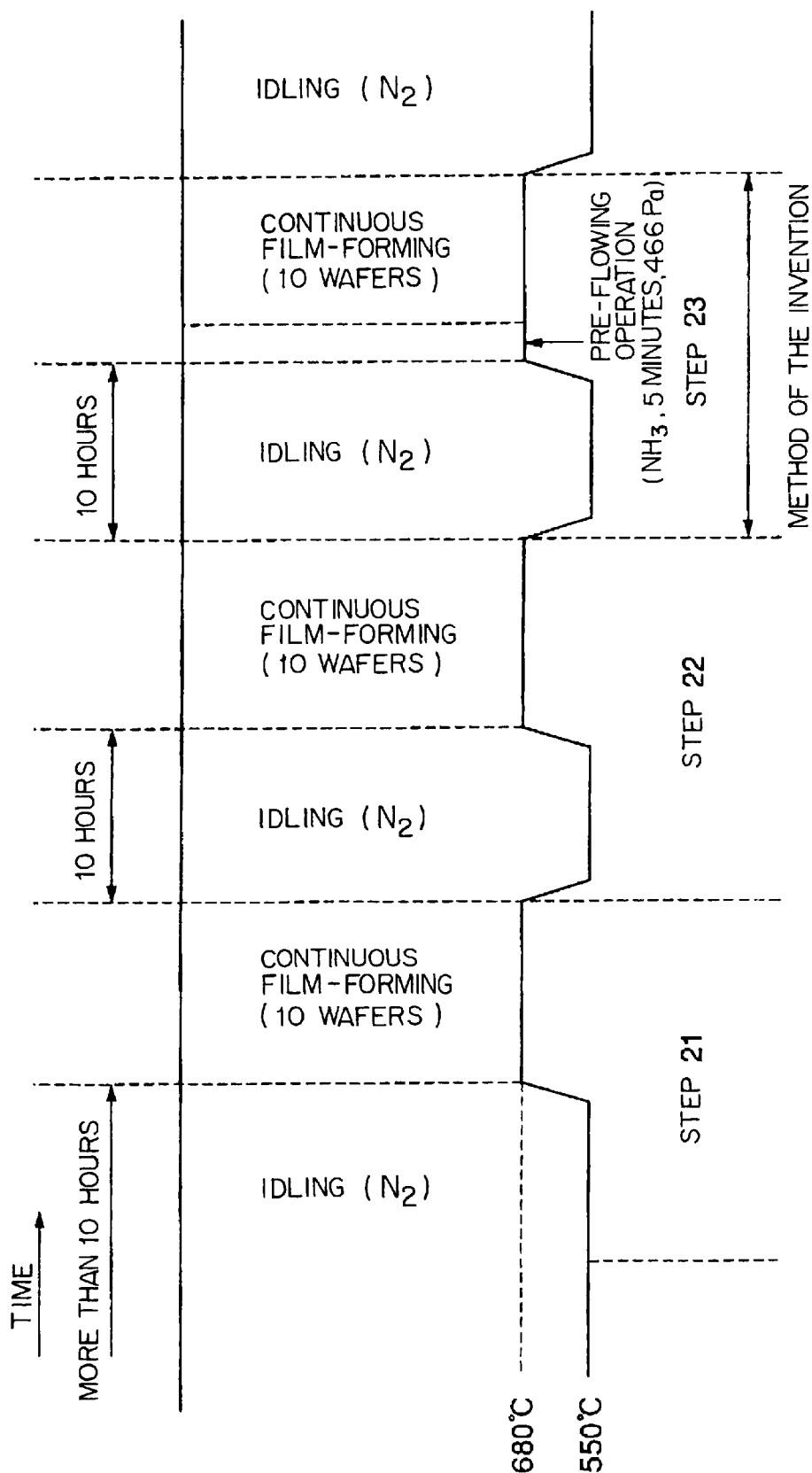
FIG. 6 is a timing chart for explaining a modified example according to the invention and comparisons thereof.
Figure 7:
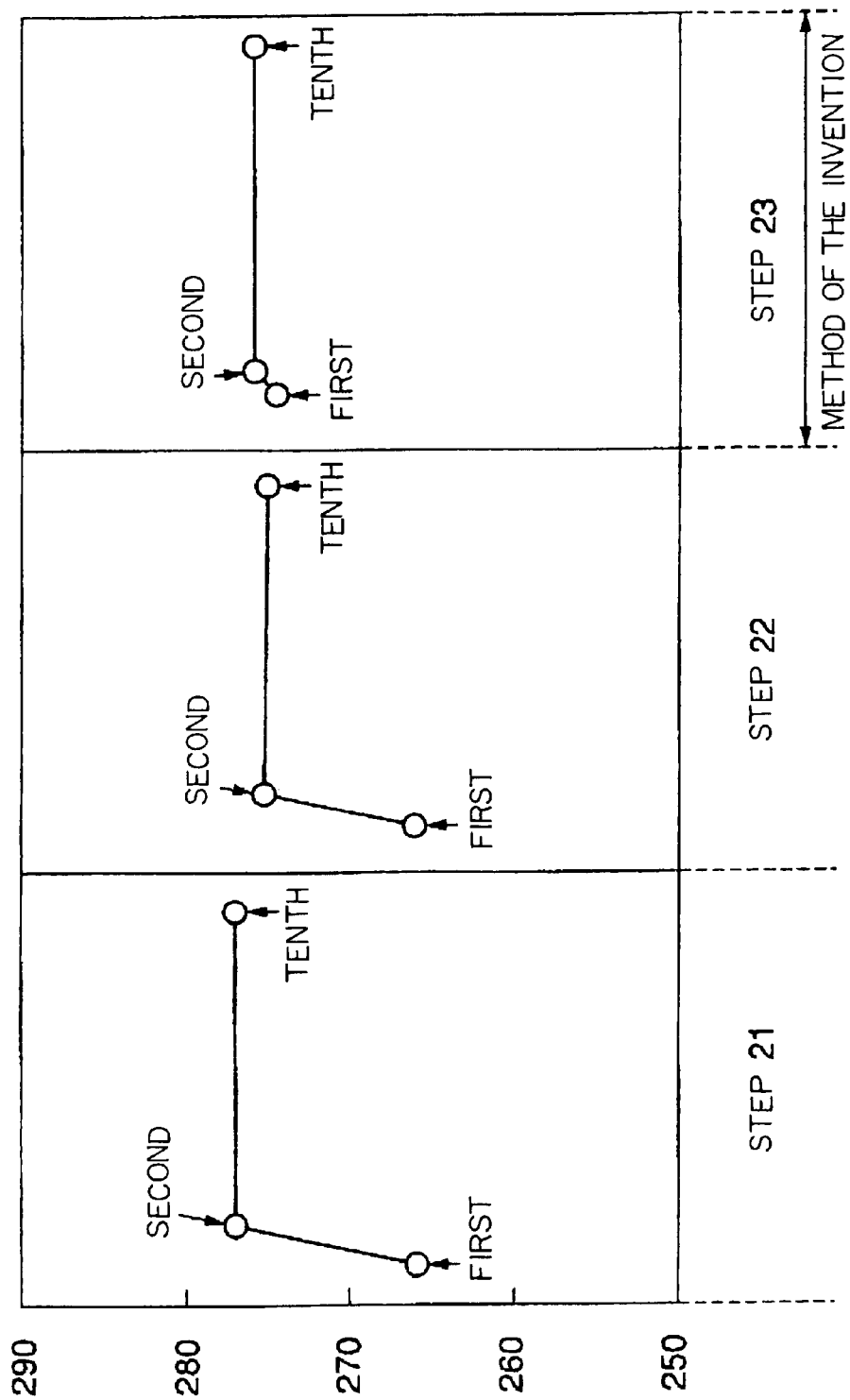
FIG. 7 is a graph for showing a result of films deposited by the method shown in FIG. 6.
Figure 8:
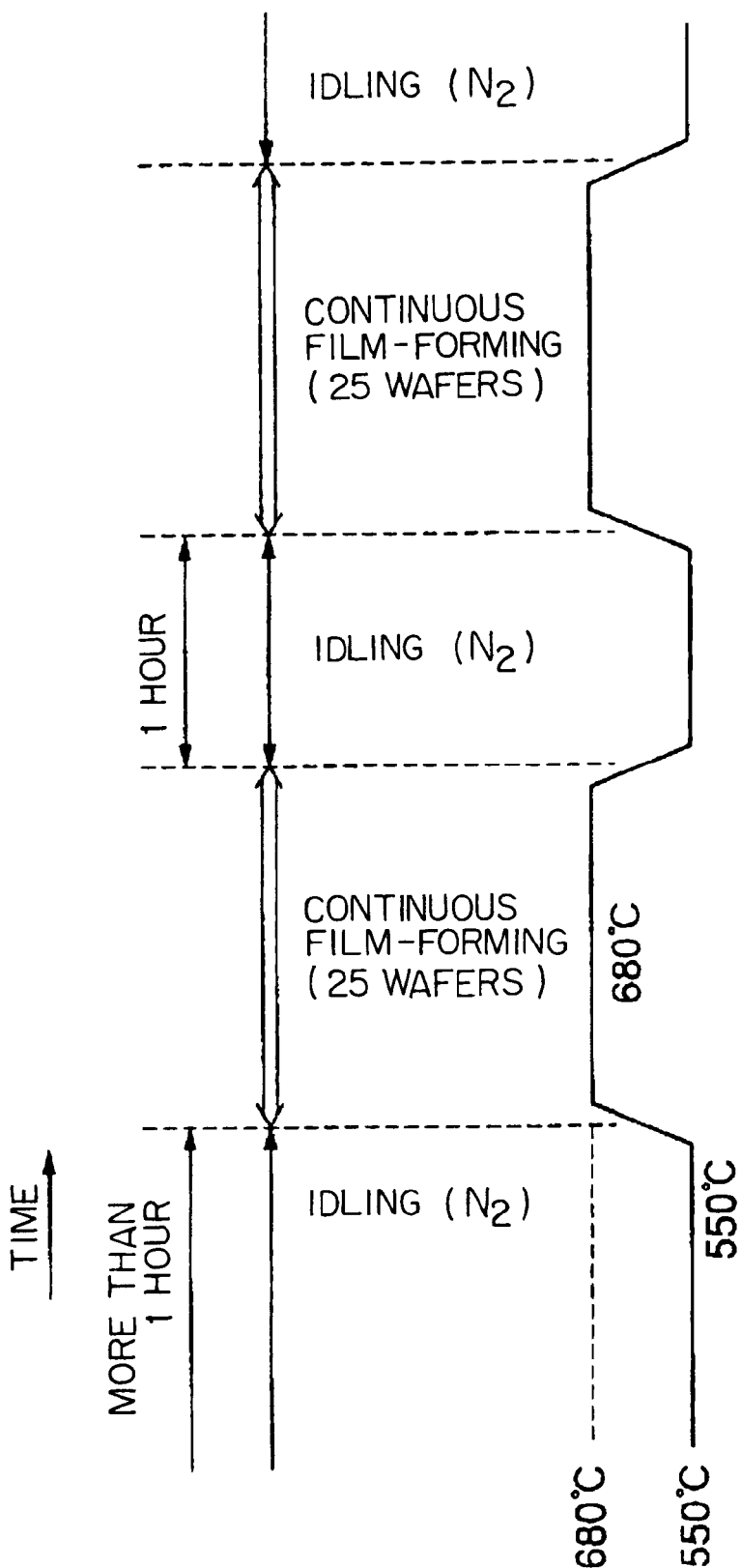
FIG. 8 is a timing chart of a conventional film-forming method.

FIG. 6 is a timing chart for explaining a modified embodiment of the invention and comparisons thereof. FIG. 7 is a graph for showing a result about the thickness of the film deposited on each of the wafers according to the timing chart shown in FIG. 6.

In the case, the film-forming process of the TiN film was continuously conducted to ten semiconductor wafers W by using the TiCl$_4$ gas and the NH$_3$ gas, during each continuous film-forming step. At that time, the process temperature was about 680° C.

Each idling step was continued for about 10 hours. During each idling step, N$_2$ gas was introduced into the processing container, and the temperature of the stage was reduced to about 550° C. In addition, in the step 23 according to the invention, just before starting the continuous film-forming process, only the NH$_3$ gas was introduced into the processing container 4 only for 5 minutes before the wafers W were loaded (a pre-flowing operation). The time during which the NH$_3$ gas is introduced is not limited by the 5 minutes, but could be for example 10 seconds or more.

FIG. 7 shows a measured result about the thickness of the film deposited on each of the wafers according to the above steps. In FIG. 7, respective values of the films on the first wafer, the second wafer and the tenth wafer are shown typically.

As seen from the graph of FIG. 7, in the conventional steps 21 and 22, the sheet resistance of the film deposited on the first wafer is lower than the sheet resistance of the film on each of the other subsequent wafers. That is, the thickness of the film on the first wafer is thicker than that on each of the other subsequent wafers. That is, the repeatability of the thickness of the film is inferior.

On the other hand, in the step 23 according to the invention, since the pre-flowing operation of introducing the NH$_3$ gas is performed just before starting the continuous film-forming process, the sheet resistance (thickness) of the film deposited on the first wafer is substantially the same as the sheet resistance (thickness) of the film on each of the other subsequent wafers. That is, the repeatability of the thickness of the film is extremely improved.

In addition, in the above embodiments, the process temperature, the idling time or the like are not limited by the values described above.

In addition, the film-forming unit is not limited by the above type that usually has a resistance heater for a single substrate. For example, the film-forming unit may have a heating lamp.

In addition, the invention can be applied to not only the film-forming process of the TiN film, but also any film-forming process by using a high-melting-point metal composition gas and a reducing gas. For example, the invention can be applied to any film-forming process of Ti film, W film, WN film, WSi film or the like.

The object to be processed is not limited by the semiconductor wafer, but could be a LCD substrate, a glass substrate or the like.

As described above, according to the film-forming method of the invention, the following effect can be achieved. That is, when a predetermined film is deposited on a surface of an object to be processed by using a high-melting-point metal composition gas and a reducing gas, atmosphere in a processing container can be maintained at substantially the same state as during a continuous film-forming process, by introducing only one of the above gases for a short time in advance. Thus, repeatablity of a thickness of the film and uniformity of the thickness within the film can be improved. In particular, when a film-forming process is continuously conducted to a plurality of objects to be processed after an idling time, repeatablity of a thickness of the film deposited on the first object and uniformity of the thickness within the film deposited on the first object can be improved.

What is claimed is:

1. A method for forming a film comprising;
   a setting step for putting an object to be processed in a processing container that can be brought into a vacuum;
   a film-forming step for introducing both of a high-melting-point metal composition gas and a reducing gas into the processing container in order to deposit a predetermined film onto a surface of the object to be processed, subsequently to the setting step; and
   a pre-flowing step for introducing only one of the high-melting-point metal composition gas and the reducing gas into the processing container for a predetermined time, before the setting step.

2. A method according to claim 1, further comprising:
   an idling step during which neither the high-melting-point metal composition gas nor the reducing gas is introduced into the processing container for a predetermined time, just before, the pre-flowing step.

3. A method according to claim 1, further comprising:
   an idling step during which said only one of the high-melting-point metal composition gas and the reducing gas is not introduced into the processing container for a predetermined time, just before the pre-flowing step.

4. A method according to claim 2, wherein:
   a high-melting-point metal composition gas is introduced into the processing container in the pre-flowing step when a thickness of a film deposited on a first object to be processed in a just subsequent film-forming step tends to be thinner than a thickness of a film deposited on each of the subsequent objects to be processed if neither the high-melting-point metal composition gas nor the reducing gas are introduced in the pre-flowing step, and a plurality of objects to be processed are processed in the subsequent film-forming step.

5. A method according to claim 2, wherein:
   a reducing gas is introduced into the processing container in the pre-flowing step when a thickness of a film deposited on a first object to be processed in a just subsequent film-forming step tends to be thicker than a thickness of a film deposited on each of the subsequent objects to be processed if neither the high-melting-point metal composition gas nor the reducing gas are introduced in the pre-flowing step, and a plurality of objects to be processed are processed in the subsequent film-forming step.

6. A method according to claim 1, wherein:
   a plurality of objects to be processed are put in the processing container in turn in the setting step, and
   a predetermined film is deposited on each of the plurality of objects to be processed successively in the film-forming step.

7. A method according to claim 6, wherein:
   a high-melting-point metal composition gas is introduced into the processing container in the pre-flowing step when a thickness of a film deposited on a first object to be processed in a just subsequent film-forming step tends to be thinner than a thickness of a film deposited on each of the subsequent objects to be processed if neither the high-melting-point metal composition gas nor the reducing gas are introduced in the pre-flowing step, and a plurality of objects to be processed are processed in the subsequent film-forming step.

8. A method according to claim 6, wherein:
   a reducing gas is introduced into the processing container in the pre-flowing step when a thickness of a film deposited on a first object to be processed in a just subsequent film-forming step tends to be thicker than a thickness of a film deposited on each of the subsequent objects to be processed if neither the high-melting-point metal composition gas nor the reducing gas are introduced in the pre-flowing step, and a plurality of objects to be processed are processed in the subsequent film-forming step.

9. A method according to claim 7, wherein:

only the high-melting-point metal composition gas is introduced into the processing container for 5 seconds or more in the pre-flowing step.

10. A method according to claim 8, wherein:

only the reducing gas is introduced into the processing container for 10 seconds or more in the pre-flowing step.

11. A method according to claim 7, further comprising:

an idling step during which the high-melting-point metal composition gas is not introduced into the processing container for a predetermined time, just before the pre-flowing step.

12. A method according to claim 8, further comprising:

an idling step during which the reducing gas is not introduced into the processing container for a predetermined time, just before the pre-flowing step.

13. A method according to claim 1, wherein:

the high-melting-point metal composition gas is $TiCl_4$ gas, and the reducing gas is $NH_3$ gas.

14. A method according to claim 1, wherein:

the predetermined film includes a component of the high-melting-point metal composition gas and a component of the reducing gas.

15. A method according to claim 14, further comprising:

an idling step during which neither the high-melting-point metal composition gas nor the reducing gas is introduced into the processing container for a predetermined time, just before the pre-flowing step.

16. A method according to claim 14, further comprising:

an idling step during which said only one of the high-melting-point metal composition gas and the reducing gas is not introduced into the processing container for a predetermined time, just before the pre-flowing step.

17. A method according to claim 14, wherein:

the high-melting-point metal composition gas is $TiCl_4$ gas, the reducing gas is $NH_3$ gas, and the predetermined film consists of TiN.

18. A method according to claim 1, wherein:

the predetermined film includes a component of said only one of the high-melting-point metal composition gas and the reducing gas.

19. A method according to claim 18, further comprising:

an idling step during which neither the high-melting-point metal composition gas nor the reducing gas is introduced into the processing container for a predetermined time, just before the pre-flowing step.

20. A method according to claim 18, further comprising:

an idling step during which said only one of the high-melting-point metal composition gas and the reducing gas is not introduced into the processing container for a predetermined time, just before the pre-flowing step.

* * * * *